(12) United States Patent
Nagamatsu et al.

(10) Patent No.: US 9,078,377 B2
(45) Date of Patent: Jul. 7, 2015

(54) AIR VOLUME CONTROL DEVICE AND AIR VOLUME CONTROL METHOD

(75) Inventors: Ikuro Nagamatsu, Kawasaki (JP); Yuji Ohba, Kawasaki (JP); Junichi Ishimine, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 554 days.

(21) Appl. No.: 13/358,593

(22) Filed: Jan. 26, 2012

(65) Prior Publication Data

US 2012/0224976 A1      Sep. 6, 2012

(30) Foreign Application Priority Data

Mar. 3, 2011   (JP) .................. 2011-046779

(51) Int. Cl.
| | |
|---|---|
| G05D 23/00 | (2006.01) |
| H05K 7/20 | (2006.01) |
| G06F 1/20 | (2006.01) |
| F24F 11/00 | (2006.01) |

(52) U.S. Cl.
CPC ......... *H05K 7/20209* (2013.01); *F24F 11/0012* (2013.01); *F24F 11/0079* (2013.01); *G06F 1/206* (2013.01); *H05K 7/20836* (2013.01); *G06F 1/20* (2013.01); *Y02B 30/746* (2013.01); *H01L 2924/0002* (2013.01)

(58) Field of Classification Search
CPC ... H05K 7/20836; H05K 7/20209; G06F 1/20
USPC .......................................... 700/300
See application file for complete search history.

(56) References Cited

U.S. PATENT DOCUMENTS

| | | | |
|---|---|---|---|
| 6,574,104 B2 * | 6/2003 | Patel et al. | ........... 361/695 |
| 7,051,946 B2 * | 5/2006 | Bash et al. | ........... 236/49.3 |
| 7,248,942 B2 | 7/2007 | Bash et al. | |

(Continued)

FOREIGN PATENT DOCUMENTS

| | | |
|---|---|---|
| CN | 1732727 A | 2/2006 |
| CN | 1795706 A | 6/2006 |

(Continued)

OTHER PUBLICATIONS

Japanese Office Action mailed Apr. 22, 2014 for corresponding Japanese Patent Application 2011-046779, with English Transilation, 7 pages.*

(Continued)

*Primary Examiner* — Robert Fennema
*Assistant Examiner* — Sivalingam Sivanesan
(74) *Attorney, Agent, or Firm* — Fujitsu Patent Center (57) ABSTRACT

An air volume control device determines whether or not a cooling capacity of an electronic device fulfills a predetermined cooling capacity. Then, if it is determined that the cooling capacity of the electronic device is failing to fulfill the predetermined cooling capacity, the air volume control device decreases the number of revolutions of a fan for cooling the electronic device. For example, the air volume control device compares a temperature of a heating element provided in the electronic device before a change in the number of revolutions of the fan with that after the change in the number of revolutions of the fan. If the temperature of the heating element is increased when the number of revolutions of the fan is increased, the air volume control device determines that the cooling capacity of the electronic device is failing to fulfill the predetermined cooling capacity.

8 Claims, 8 Drawing Sheets

(56) References Cited

U.S. PATENT DOCUMENTS

| | | | |
|---|---|---|---|
| 7,283,358 B2 * | 10/2007 | Campbell et al. | 361/694 |
| 7,397,661 B2 | 7/2008 | Campbell et al. | |
| 7,499,770 B2 * | 3/2009 | Sawada | 700/304 |
| 8,244,502 B2 | 8/2012 | Hamann et al. | |
| 8,544,289 B2 * | 10/2013 | Johnson et al. | 62/186 |
| 2008/0300818 A1 * | 12/2008 | Brey et al. | 702/130 |
| 2011/0195652 A1 * | 8/2011 | Smith | 454/184 |

FOREIGN PATENT DOCUMENTS

| | | | | |
|---|---|---|---|---|
| CN | 1901792 | A | | 1/2007 |
| CN | 1943292 | A | | 4/2007 |
| CN | 101132688 | A | | 2/2008 |
| JP | 63-251817 | A | | 10/1988 |
| JP | 02-123413 | A | | 5/1990 |
| JP | 9-186477 | A | | 7/1997 |
| JP | 11-264599 | A | | 9/1999 |
| JP | 2002123413 | A | * | 4/2002 ............... G06F 1/20 |
| JP | 2006-156871 | A | | 6/2006 |
| JP | 2008-171219 | A | | 7/2008 |
| JP | 2009-260135 | A | | 11/2009 |

OTHER PUBLICATIONS

Chinese Office Action mailed Dec. 23, 2013 for corresponding Chinese Application No. 201210021897.7, with Partial English-language Translation.

Japanese Office Action mailed Apr. 14, 2014 for corresponding Japanese Patent Application 2011-046779, with English Translation, 7 pages.

Japanese Office Action mailed Apr. 22, 2014 for corresponding Japanese Patent Application 2011-046779, with English Translation, 7 pages.

* cited by examiner

| NUMBER OF REVOLUTIONS | AIR VOLUME PASSING THROUGH FLOOR SURFACE APERTURED PANEL [m³/S] | AIR VOLUME TAKEN IN BY ELECTRONIC DEVICE [m³/S] | ELECTRONIC COMPONENT TEMPERATURE [°C] |
|---|---|---|---|
| R1 | 0.12 | 0.06 | 98 |
| R2 | 0.12 | 0.09 | 78 |
| R3 | 0.12 | 0.12 | 71 |
| R4 | 0.12 | 0.15 | 86 |
| R5 | 0.12 | 0.18 | 90 |
| R6 | 0.12 | 0.21 | 90 |
| R7 | 0.12 | 0.24 | 86 |

AIR VOLUME CONTROL DEVICE AND AIR VOLUME CONTROL METHOD

CROSS-REFERENCE TO RELATED APPLICATION

This application is based upon and claims the benefit of priority of the prior Japanese Patent Application No. 2011-046779, filed on Mar. 3, 2011, the entire contents of which are incorporated herein by reference.

FIELD

The embodiments discussed herein are directed to an air volume control device, an air volume control method, and an air volume control program.

BACKGROUND

Figure 9:
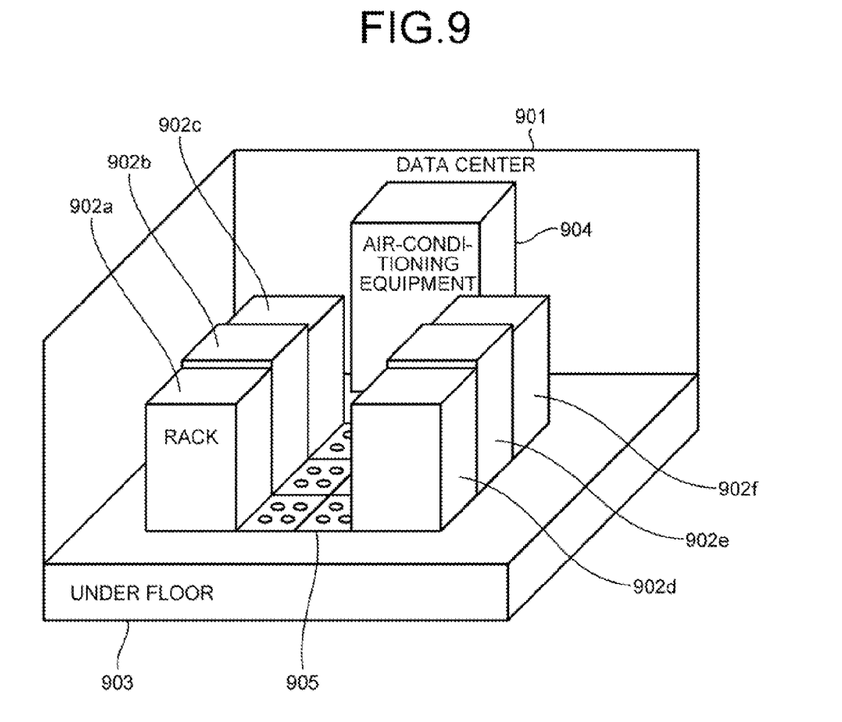
FIG. 9 is a diagram illustrating an exemplary configuration of a data center.

In recent years, there have been cases such that electronic devices such as servers are managed collectively in a data center or the like. With reference to FIG. 9, an exemplary configuration of a data center will be described. FIG. 9 is a diagram illustrating an exemplary configuration of a data center. As illustrated in FIG. 9, in a data center 901, a plurality of racks 902a to 902f are installed in columns with front surfaces and rear surfaces thereof facing the same directions, respectively. Then, a plurality of electronic devices such as servers are installed in each of the racks 902a to 902f.

Moreover, in an electronic device such as a server, an amount of heat generation in an electronic component such as a CPU (central processing unit) has been continuously increasing. If a temperature of an electronic component as represented by a CPU becomes high, the electronic device may be operationally unstable. Therefore, in the data center, the electronic components are appropriately cooled so that the electronic devices can operate stably.

In the example illustrated in FIG. 9, cooling air of 20 to 25° C., for example, is blown out from an under floor 903 by an air-conditioning equipment 904, and is supplied to the racks 902a to 902f via floor surface apertured panels 905. The electronic devices mounted in the racks 902a to 902f rotate fans included therein to take in the cooling air from outside of housings of the electronic devices, thereby cooling the electronic components within the housings.

An amount of heat generation in a CPU changes in accordance with an amount of processing load. Therefore, in the data center, the electronic device changes the number of revolutions of the fan in accordance with the amount of heat generation in the CPU so as to change an amount of cooling air to be taken in from outside of the electronic device. For example, the number of revolutions of the fan is set in accordance with an intake air temperature of the electronic device or a CPU temperature.

Patent Literature 1: Japanese Laid-open Patent Publication No. 11-264599

Patent Literature 2: Japanese Laid-open Patent Publication No. 02-123413

However, the above-described conventional technique has a problem that there is a case where it is not possible to prevent an increase in electronic component temperature.

Specifically, in the conventional data center, a sufficient amount of cooling air has been supplied to racks via floor surface apertured panels with respect to an amount of cooling air taken in inside the housings of the electronic devices by the electronic devices. Thus, the electronic devices take in inside the housings thereof the cooling air supplied to the racks via the floor surface apertured panels, thereby appropriately cooling the electronic components of the electronic devices.

In recent years, however, a rack in a data center mounts a blade server having an improved processing capability and a larger amount of heat generation as compared to a conventional server. In such a data center, there is a case where an amount of air taken in by electronic devices becomes greater than cooling air supplied to the racks via the floor surface apertured panels. In such a case, there occurs a hot spot phenomenon such that warm exhaust air exhausted by the electronic devices is taken in again by the electronic devices together with the cooling air supplied to the racks. Such a situation that discharge from an electronic device is taken in again by the electronic device is called "exhaust air recirculation."

Since the conventional data center does not deal with the possibility of an environment in which exhaust air recirculation occurs, exhaust air recirculation cannot be eliminated. Therefore, if a hot spot phenomenon is generated, even when the number of revolutions of the fan is increased so as to increase an amount of cooling air to be taken in by the electronic device, the electronic device takes in exhaust air therefrom together with the cooling air. Thus, due to the exhaust air from the electronic device, a temperature of the cooling air taken in by the electronic device increases. As a result, it fails to appropriately cool the electronic component and the temperature thereof thus increases.

Figure 10:
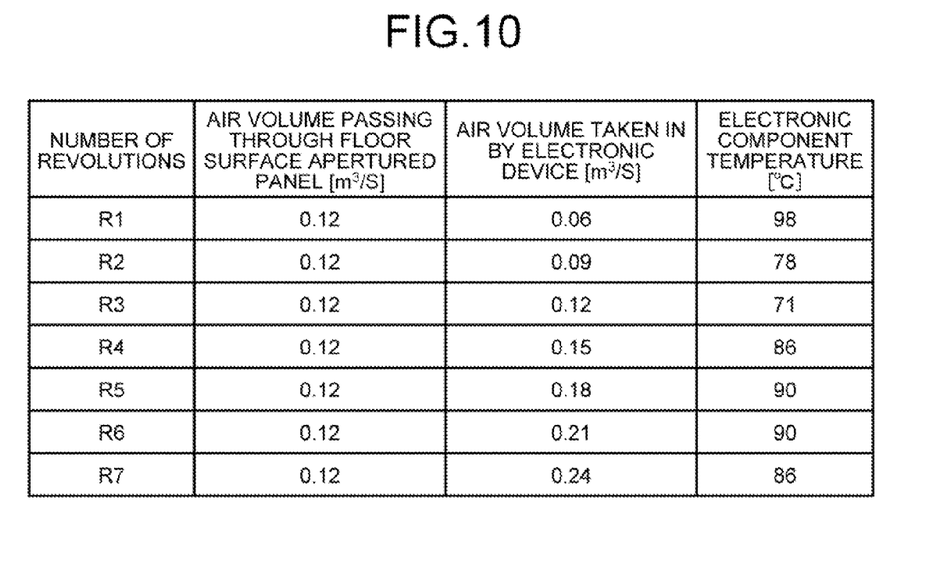
FIG. 10 is a diagram illustrating changes in electronic component temperature when the number of fan revolutions is varied in a data center where racks having blade servers mounted therein are arranged.

With reference to FIG. 10, there is illustrated an example. FIG. 10 is a diagram illustrating changes in an electronic component temperature when the number of fan revolutions is varied in a data center where racks having blade servers mounted therein are arranged. In cases of the number of revolutions R1 to R3 illustrated in FIG. 10, an amount of cooling air supplied to the racks via the floor surface apertured panels is sufficient for an amount of cooling air taken in by the electronic devices. In such a case, by increasing the number of revolutions from R1 to R2, and then to R3, an air volume of the electronic device increases, and the electronic component temperature is therefore decreased from 98° C. to 71° C.

On the other hand, in cases of the number of revolutions R4 to R7 illustrated in FIG. 10, an amount of air taken in by the electronic devices becomes greater than the cooling air supplied to the racks via the floor surface apertured panels. In such a case, exhaust air recirculation occurs, and the electronic component temperature is increased from 86° C. to 90° C. Thus, in the conventional data center, it is not possible to prevent an increase in electronic component temperature when there is exhaust air recirculation.

SUMMARY

According to an aspect of an embodiment of the invention, an air volume control device includes a determination unit that determines whether or not a cooling capacity of an electronic device fulfills a predetermined cooling capacity, a decreasing unit that decreases the number of revolutions of a fan for cooling the electronic device if the determination unit determines that the cooling capacity of the electronic device is failing to fulfill the predetermined cooling capacity.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawings. It is to be understood that the present invention is not limited by these embodiments. Although in the following embodiments, a 1U server, which is a type of blade server (or rack-mount server), is employed as an example of an electronic device, the present invention is not limited to this and can be applied to computer devices in general having other housing sizes or housing shapes.

[a] First Embodiment

Figure 1:
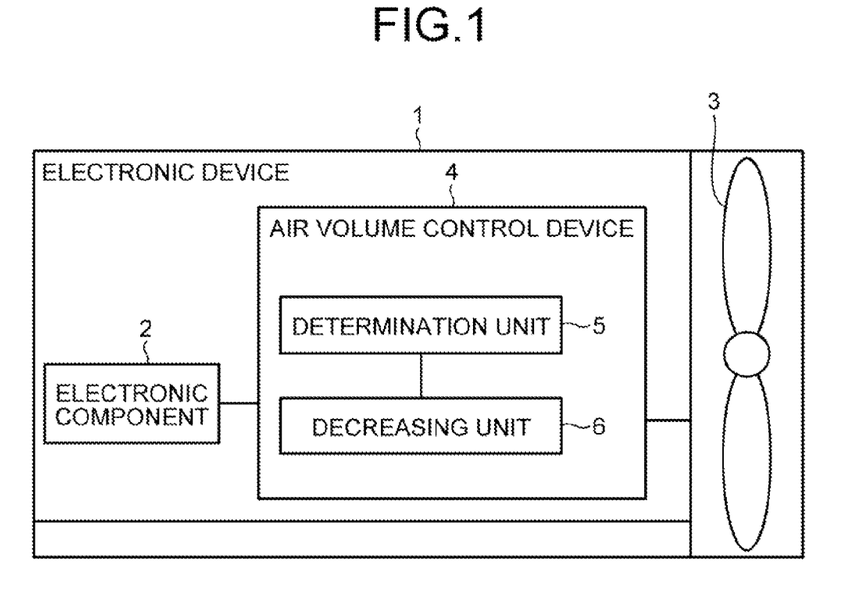
FIG. 1 is a block diagram illustrating a configuration of an electronic device containing an air volume control device according to a first embodiment.

FIG. 1 is a block diagram illustrating a configuration of an electronic device containing an air volume control device according to the first embodiment. As illustrated in FIG. 1, an electronic device 1 has an electronic component 2, a fan 3, and an air volume control device 4. The electronic device 1 is a 1U server containing the electronic component 2 inside a housing of about 45 mm in height×about 19 inches in width×about 540 mm in depth, for example. Note that the numbers of electronic components and fans are merely illustrative in the first embodiment, and the numbers thereof are not limited thereto.

Examples of the electronic component 2 include a CPU (central processing unit), a RAM (random access memory), and an HDD (hard disk drive). The electronic component 2 radiates heat generated from a surface of the electronic component 2 to air taken in inside the electronic device 1 by the fan 3 via a radiator such as a heat sink. Note that the electronic component 2 is an example of a heating element.

The fan 3 is an axial flow fan of a PWM (pulse width modulation) type or the like, for example. When an applied frequency of a driving voltage is changed by a decreasing unit 6 to be described later, the fan 3 changes the number of revolutions thereof. For example, when a temperature of the electronic component 2 is increased, the fan 3 increases the number of revolutions thereof to increase the wind speed of the fan, thereby cooling the electronic component 2.

The air volume control device 4 includes a determination unit 5 and the decreasing unit 6. The determination unit 5 determines whether or not the cooling capacity of the electronic device 1 fulfills a predetermined cooling capacity. For example, the determination unit 5 determines whether or not air exhausted from the electronic device 1 has been recirculated into air sucked in by the electronic device 1. If it is determined that recirculation has occurred, the determination unit 5 determines that the cooling capacity of the electronic device 1 is failing to fulfill the predetermined cooling capacity.

If it is determined by the determination unit 5 that the cooling capacity of the electronic device 1 is failing to fulfill the predetermined cooling capacity, the decreasing unit 6 decreases the number of revolutions of the fan 3 for cooling the electronic device 1.

As described above, if air exhausted from the electronic device 1 is recirculated into cooling air sucked in by the electronic device 1, the determination unit 5 determines that the cooling capacity of the electronic device 1 is failing to fulfill the predetermined cooling capacity. If it is determined by the determination unit 5 that the cooling capacity of the electronic device 1 is failing to fulfill the predetermined cooling capacity, the decreasing unit 6 decreases the number of revolutions of the fan 3, thereby eliminating the recirculation. As a result, if it is determined that the cooling capacity of the electronic device 1 is failing to fulfill the predetermined cooling capacity, the air volume control device 4 according to the first embodiment can prevent an increase in temperature of the electronic component 2 by decreasing the number of revolutions of the fan 3 for cooling the electronic component 2.

[b] Second Embodiment

Next, in the second embodiment, a case will be described where an air volume control device monitors a temperature of an electronic component and determines whether or not there is recirculation, thereby determining whether or not the cooling capacity of an electronic device fulfills a predetermined cooling capacity. The air volume control device according to the second embodiment performs feedback control such that the number of fan revolutions is increased in accordance with an increase in the temperature of the electronic component and the number of fan revolutions is decreased in accordance with a decrease in the temperature of the electronic component during normal times. The air volume control device determines whether or not there is recirculation at a period of time during which there is no change in load on the electronic component. If it is determined that there is recirculation, the air volume control device performs control for restoring the number of fan revolutions to obtain a state where no recirculation occurs. Here, a configuration of the electronic device containing the air volume control device according to the second embodiment, a processing procedure by the air volume control device according to the second embodiment, and an advantageous effect of the second embodiment will be described in order.

Figure 2:
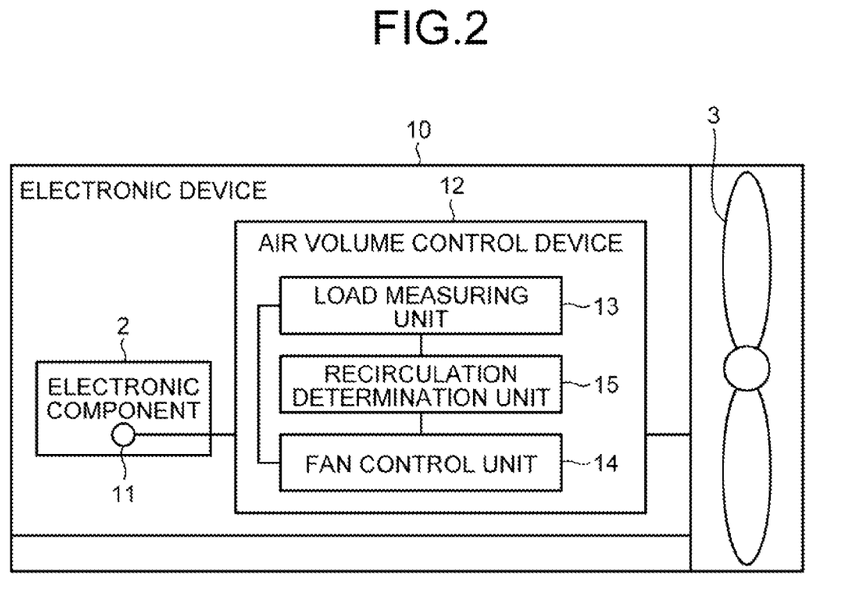
FIG. 2 is a block diagram illustrating a configuration of an electronic device containing an air volume control device according to a second embodiment.

Configuration of Electronic Device Containing Air Volume Control Device According to the Second Embodiment Next, with reference to FIG. 2, the configuration of the electronic device containing the air volume control device according to the second embodiment will be described. FIG. 2 is a block diagram illustrating the configuration of the electronic device containing the air volume control device according to the second embodiment. An electronic device 10 according to the second embodiment includes the electronic component 2, the fan 3, a temperature detecting unit 11, and an air volume control device 12. The electronic device 10 is a 1U server containing the electronic component 2 and the like inside a housing of about 45 mm in height×about 19 inches in width×about 540 mm in depth, for example. Note that functional units operating similarly to the units illustrated in FIG. 1 are denoted by the same reference numerals and the detailed descriptions thereof will be omitted. Moreover, the numbers of electronic components, temperature detecting units, and fans are merely illustrative in the second embodiment, and the numbers thereof are not limited thereto.

The temperature detecting unit 11 is a thermal diode inside an LSI, for example, and periodically measures the temperature of the electronic component 2 after the acceptance of an instruction for starting control from a user via an accepting unit not illustrated in the figure. Note that the temperature of the electronic component 2 is hereinafter referred to as an electronic component temperature Tj. For example, the temperature detecting unit 11 periodically measures the electronic component temperature Tj, converts the measured electronic component temperature Tj into an electrical signal, and outputs the electrical signal to a recirculation determination unit 15 and a fan control unit 14. In one example, where the electronic component temperature Tj is "50° C.," the temperature detecting unit 11 outputs to the fan control unit 14 and the recirculation determination unit 15 that the electronic component temperature Tj is "50° C."

The air volume control device 12 includes a load measuring unit 13, the fan control unit 14, and the recirculation determination unit 15. The air volume control device 12 includes an internal memory for storing a control program, a program specifying various processing procedures, and data. For example, the air volume control device 12 is an integrated circuit such as ASIC (application specific integrated circuit) or FPGA (field programmable gate array), or an electronic circuit such as a CPU or an MPU.

The load measuring unit 13 measures a load on the electronic component 2, and determines whether or not the load on the electronic component 2 has changed. For example, where the electronic component 2 is a CPU, the load measuring unit 13 periodically measures CPU utilization after the acceptance of an instruction for starting control from a user via an accepting unit not illustrated in the figure. Then, the load measuring unit 13 compares the currently-measured CPU utilization with the previously-measured CPU utilization to determine whether or not the CPU utilization has changed. Note that the load measuring unit 13 is an example of a measuring unit.

If it is determined that there is no change in CPU utilization, the load measuring unit 13 notifies the fan control unit 14 and the recirculation determination unit 15 of the measured CPU utilization and that there is no change in CPU utilization. Moreover, if it is determined that there is a change in CPU utilization, the load measuring unit 13 notifies the fan control unit 14 and the recirculation determination unit 15 that the CPU utilization has changed.

The fan control unit 14 is a control unit for changing an applied frequency of a driving voltage to change the number of revolutions of the fan 3, and it is an example of the decreasing unit. For example, if the fan control unit 14 is notified by the load measuring unit 13 that there is a change in CPU utilization, the fan control unit 14 calculates the number of fan revolutions suitable for cooling the electronic component from the electronic component temperature Tj, and changes the number of revolutions of the fan 3 to the calculated number of revolutions. Note that the number of fan revolutions in accordance with the electronic component temperature Tj is set in advance by a user. Therefore, the fan control unit 14 can calculate the number of fan revolutions suitable for cooling the electronic component from the electronic component temperature Tj.

Moreover, if the fan control unit 14 is notified by the recirculation determination unit 15 that determination regarding whether or not recirculation has occurred is to be started, the fan control unit 14 changes the number of revolutions of the fan 3. For example, the fan control unit 14 increases or decreases the number of revolutions of the fan 3. Moreover, if the fan control unit 14 is notified by the recirculation determination unit 15 that recirculation has occurred, the fan control unit 14 decreases the number of revolutions of the fan 3.

The recirculation determination unit 15 is a control unit for determining whether or not recirculation has occurred when the recirculation determination unit 15 is notified by the load measuring unit 13 that there is no change in CPU utilization, and it is an example of the determination unit. For example, if the electronic component temperature Tj is decreased after the number of fan revolutions is reduced by the fan control unit 14, the recirculation determination unit 15 determines that recirculation has occurred. If the electronic component temperature Tj is increased after the number of fan revolutions is increased by the fan control unit 14, the recirculation determination unit 15 determines that recirculation has occurred. Hereinafter, an operation by the recirculation determination unit 15 will be described in detail.

First, if the recirculation determination unit 15 is notified by the load measuring unit 13 that there is no change in CPU utilization, the recirculation determination unit 15 notifies the fan control unit 14 that determination regarding whether or not recirculation has occurred is to be started. As a result, the fan control unit 14 changes the number of revolutions of the fan 3. Note that a case where the recirculation determination unit 15 determines whether or not recirculation has occurred after the number of revolutions of the fan 3 is increased by the fan control unit 14 will be explained herein.

The recirculation determination unit 15 determines whether or not it is in a steady state after the number of fan revolutions is increased by the fan control unit 14. A steady state used herein refers to a state in which the fan 3 is stably operated with the number of revolutions being restored to a certain number of revolutions after the number of revolutions is increased by the fan 3 to the changed set value. If it is determined to be in a steady state, the recirculation determination unit 15 determines whether or not the electronic component temperature Tj has increased as compared to that before the increase in the number of fan revolutions, and thus determines whether or not recirculation has occurred.

If it is determined that the electronic component temperature Tj has not increased as compared to that before the increase in the number of fan revolutions, the recirculation determination unit 15 determines that there is no recirculation, and transitions to a normal control state again. On the other hand, if it is determined that the electronic component temperature Tj has increased as compared to that before the increase in the number of fan revolutions, the recirculation determination unit 15 determines that recirculation has occurred and starts a process of restoring the number of fan revolutions to obtain a state with no recirculation. For example, the recirculation determination unit 15 notifies the fan control unit 14 that recirculation has occurred. As a result, the fan control unit 14 decreases the number of fan revolutions.

After the process of restoring a state with no recirculation is started, the recirculation determination unit 15 determines whether or not it is in a steady state. If it is determined to be in a steady state, the recirculation determination unit 15 determines whether or not the electronic component temperature Tj has decreased as compared to that before the decrease in the number of fan revolutions. If it is determined that the electronic component temperature Tj has decreased as compared to that before the decrease in the number of fan revolutions, the recirculation determination unit 15 determines that recirculation has been eliminated, and transitions to a normal control state again. On the other hand, if it is determined that the electronic component temperature Tj has not decreased as compared to that before the decrease in the number of fan revolutions, the recirculation determination unit 15 determines that recirculation has not been eliminated yet, and repeats an operation of further decreasing the number of fan revolutions until it is determined that recirculation has been eliminated.

If it is determined to be not in a steady state after determination regarding whether or not recirculation has occurred is started and after the process of restoring a state with no recirculation is started, the recirculation determination unit 15 determines whether or not there is a change in CPU utilization notified by the load measuring unit 13. If the recirculation determination unit 15 is notified by the load measuring unit 13 that there is no change in CPU utilization, the recirculation determination unit 15 continuously determines whether or not it is in a steady state.

Note that if the recirculation determination unit 15 is notified by the load measuring unit 13 that there is a change in CPU utilization, the recirculation determination unit 15 does not perform the process of determining whether or not recirculation has occurred. Moreover, if the recirculation determination unit 15 is notified by the load measuring unit 13 that there is a change in CPU utilization after the process of determining whether or not recirculation has occurred is started, the recirculation determination unit 15 terminates the process of determining whether or not recirculation has occurred. Similarly, if the recirculation determination unit 15 is notified by the load measuring unit 13 that there is a change in CPU utilization after the process of restoring a state with no recirculation is started, the recirculation determination unit 15 terminates the process of restoring a state with no recirculation.

Figure 3:
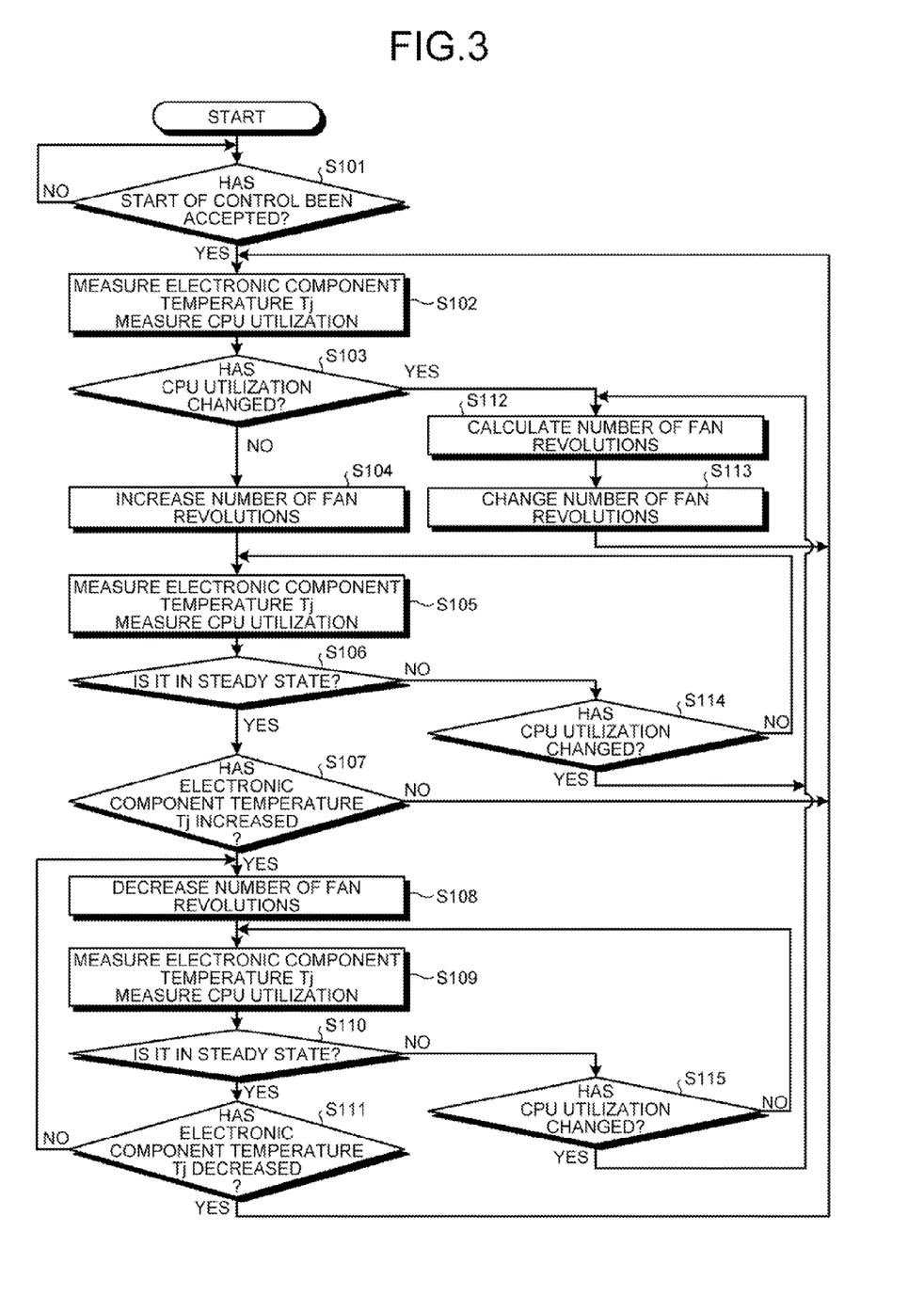
FIG. 3 is a flow chart illustrating a processing procedure by the air volume control device according to the second embodiment.

Processing Procedure by Air Volume Control Device According to the Second Embodiment Next, with reference to FIG. 3, a processing procedure by the air volume control device 12 according to the second embodiment will be described. FIG. 3 is a flow chart illustrating the processing procedure by the air volume control device according to the second embodiment.

As illustrated in FIG. 3, if the air volume control device 12 accepts start of control from a user (step S101, Yes), the air volume control device 12 measures the electronic component temperature Tj and the CPU utilization (step S102). Note that the air volume control device 12 thereafter measures the electronic component temperature Tj and the CPU utilization periodically.

Subsequently, the air volume control device 12 determines whether or not there is a change in CPU utilization (step S103). Here, if it is determined that there is a change in CPU utilization (step S103, Yes), the air volume control device 12 calculates the number of revolutions of the fan 3 suitable for cooling the electronic component (step S112), and changes the number of revolutions to the calculated number of revolutions (step S113). Thereafter, the air volume control device 12 proceeds to step S102, and performs processes to follow.

On the other hand, if it is determined that there is no change in CPU utilization in step S103 (step S103, No), the air volume control device 12 increases the number of revolutions of the fan 3 (step S104), and measures the electronic component temperature Tj and the CPU utilization (step S105).

Then, the air volume control device 12 determines whether or not it is in a steady state (step S106). Here, if it is determined to be not in a steady state (step S106, No), the air volume control device 12 determines whether or not there is a change in CPU utilization (step S114). If it is determined that there is a change in CPU utilization (step S114, Yes), the air volume control device 12 proceeds to step S112, and performs the processes to follow. On the other hand, if it is determined that there is no change in CPU utilization (step S114, No), the air volume control device 12 proceeds to step S105, and performs the processes to follow.

On the other hand, if it is determined to be in a steady state (step S106, Yes), the air volume control device 12 determines whether or not the electronic component temperature Tj has increased (step S107). Here, if it is determined that the electronic component temperature Tj has not increased (step S107, No), the air volume control device 12 proceeds to step S102, and performs the processes to follow. On the other hand, if it is determined that the electronic component temperature Tj has increased (step S107, Yes), the air volume control device 12 decreases the number of revolutions of the fan 3 (step S108).

Subsequently, the air volume control device 12 measures the electronic component temperature Tj and the CPU utilization (step S109). Then, the air volume control device 12 determines whether or not it is in a steady state (step S110). Here, if it is determined to be not in a steady state (step S110, No), the air volume control device 12 determines whether or not there is a change in CPU utilization (step S115). If it is determined that there is a change in CPU utilization (step S115, Yes), the air volume control device 12 proceeds to step S112, and performs the processes to follow. On the other hand, if it is determined that there is no change in CPU utilization (step S115, No), the air volume control device 12 proceeds to step S109, and performs the processes to follow.

If it is determined to be in a steady state in step S110, the air volume control device 12 determines whether or not the electronic component temperature Tj has decreased as compared to that before the decrease in the number of fan revolutions (step S111). Here, if it is determined that the electronic component temperature Tj has not decreased as compared to that before the decrease in the number of fan revolutions (step S111, No), the air volume control device 12 proceeds to step S108 and performs the processes to follow. On the other hand, if it is determined that the electronic component temperature Tj has decreased as compared to that before the decrease in the number of fan revolutions (step S111, Yes), the air volume control device 12 proceeds to step S102 and performs the processes to follow.

Advantageous Effect of Second Embodiment

As described above, according to the second embodiment, the air volume control device 12 can determine whether or not there is recirculation based on an increase or decrease in the electronic component temperature Tj between before and after a change in the number of fan revolutions. If it is determined that there is recirculation, the air volume control device 12 decreases the number of fan revolutions to eliminate recirculation. Thus, it is possible to prevent an increase in the electronic component temperature Tj.

Moreover, if there is no change in load on the electronic component, the air volume control device 12 according to the second embodiment determines whether or not there is recirculation. Thus, if there is an increase in the CPU utilization and the electronic component temperature Tj is thereby increased, for example, the air volume control device 12 does not determine whether or not recirculation has occurred, and changes the number of fan revolutions to that calculated from the electronic component temperature Tj and suitable for cooling the electronic component. Therefore, when there is no change in load on the electronic component, the air volume control device 12 according to the second embodiment can prevent an increase in the electronic component temperature by determining whether or not recirculation has occurred. When there is a change in load on the electronic component, the air volume control device 12 according to the second embodiment can cool the electronic component with the number of fan revolutions suitable for cooling the electronic component.

[c] Third Embodiment

The second embodiment described an example in which the air volume control device 12 measures the electronic component temperature Tj to determine whether or not there is recirculation and thereby determine whether or not the cooling capacity of the electronic device fulfills the predetermined cooling capacity. By the way, if recirculation occurs in a data center, the temperature of air sucked in by the electronic device is also increased. Therefore, the air volume control device may determine whether or not recirculation has occurred based on the temperature of air sucked in by the electronic device.

Thus, the third embodiment describes a case where an air volume control device detects a temperature of air sucked in by an electronic device and determines whether or not recirculation has occurred based on the detected temperature of air sucked in by the electronic device, thereby determining whether or not the cooling capacity of the electronic device fulfills a predetermined cooling capacity. Here, a configuration of an electronic device containing the air volume control device according to the third embodiment, a processing procedure by the air volume control device according to the third embodiment, and an advantageous effect of the third embodiment will be described in order.

Figure 4:
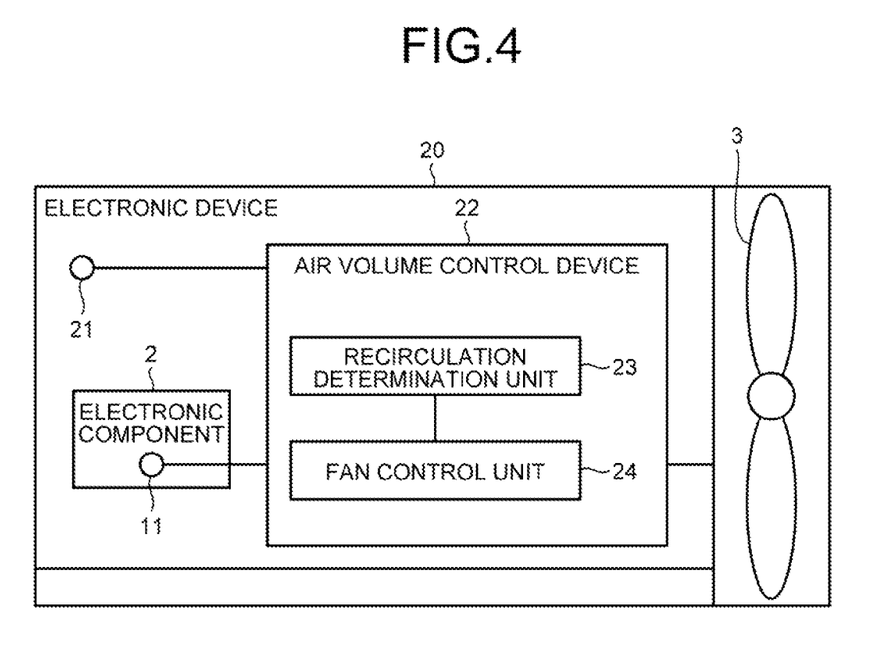
FIG. 4 is a block diagram illustrating a configuration of an electronic device containing an air volume control device according to a third embodiment.

Configuration of Electronic Device Containing Air Volume Control Device According to the Third Embodiment Next, with reference to FIG. 4, the configuration of the electronic device containing the air volume control device according to the third embodiment will be described. FIG. 4 is a block diagram illustrating the configuration of the electronic device containing the air volume control device according to the third embodiment. An electronic device 20 containing the air volume control device according to the third embodiment includes the electronic component 2, the fan 3, the temperature detecting unit 11, a temperature detecting unit 21, and an air volume control device 22. Note that functional units operating similarly to the units illustrated in FIG. 2 are denoted by the same reference numerals and the detailed descriptions thereof will be omitted herein. Moreover, the numbers of electronic components, temperature detecting units, and fans are merely illustrative in the third embodiment, and the numbers thereof are not limited thereto.

The temperature detecting unit 21 is a thermistor provided in the vicinity of an intake vent of the electronic device, for example. The temperature detecting unit 21 periodically detects the temperature of air sucked in by the electronic device 20 after the acceptance of the start of control from a user. Note that a temperature of air sucked in by the electronic device 20 is hereinafter referred to as a device intake air temperature Ta. For example, the temperature detecting unit 21 periodically measures the device intake air temperature Ta, and outputs the measured device intake air temperature Ta to a recirculation determination unit 23. In one example, if the device intake air temperature Ta is "40° C.," the temperature detecting unit 21 outputs "40° C." to the recirculation determination unit 23.

The air volume control device 22 includes the recirculation determination unit 23 and a fan control unit 24. The air volume control device 22 determines whether or not recirculation has occurred, and if there is recirculation, the air volume control device 22 eliminates the recirculation.

The recirculation determination unit 23 is a control unit for determining whether or not recirculation has occurred based on the device intake air temperature Ta and the number of fan revolutions, and is an example of the determination unit. For example, the recirculation determination unit 23 determines whether or not the device intake air temperature Ta detected by the temperature detecting unit 21 exceeds a predetermined temperature threshold Ts. If it is determined that the device intake air temperature Ta exceeds the predetermined temperature threshold Ts, the recirculation determination unit 23 compares the number of fan revolutions at a time when the device intake air temperature Ta exceeds the predetermined temperature threshold Ts with the number of fan revolutions T seconds prior to that time. Note that the time of T seconds is a predetermined value, and a value that can be set arbitrarily by a user. If it is determined that the number of fan revolutions has increased, the recirculation determination unit 23 determines that recirculation has occurred, considering that the device intake air temperature Ta has increased due to an influence of such an increase in the number of revolutions. Note that the predetermined temperature threshold Ts can be set arbitrarily by a user, and is, for example, "55° C."

If it is determined that recirculation has occurred, the recirculation determination unit 23 starts a process to restore a state with no recirculation. For example, the recirculation determination unit 23 notifies the fan control unit 24 that recirculation has occurred. As a result, the fan control unit 24 decreases the number of fan revolutions. The recirculation determination unit 23 determines whether or not it is in a steady state after the process to restore a state with no recirculation is started.

If it is determined to be in a steady state, the recirculation determination unit 23 determines whether or not the device intake air temperature Ta is lower than the predetermined temperature threshold Ts. If it is determined that the device intake air temperature Ta is lower than the predetermined temperature threshold Ts, the recirculation determination unit 23 determines that recirculation has been eliminated. Then, the recirculation determination unit 23 transitions to a normal control state again.

On the other hand, if it is determined that recirculation has not been eliminated yet, the recirculation determination unit 23 notifies the fan control unit 24 that recirculation has not been eliminated yet. As a result, the fan control unit 24 repeats an operation of further decreasing the number of fan revolutions until it is determined that recirculation has been eliminated.

If it is determined to be not in a steady state, the recirculation determination unit 23 determines whether or not the electronic component temperature Tj exceeds the predetermined upper limit. Here, if it is determined that the electronic component temperature Tj exceeds the predetermined upper limit, the recirculation determination unit 23 notifies the fan control unit 24 that the electronic component temperature Tj exceeds the predetermined upper limit. As a result, the fan control unit 24 increases the number of fan revolutions until the electronic component temperature Tj becomes lower than the predetermined upper limit. On the other hand, if it is determined that the electronic component temperature Tj does not exceed the predetermined upper limit, the recirculation determination unit 23 continuously determines whether or not it is in a steady state. Note that the predetermined upper limit can be set arbitrarily by a user, and is, for example, "80° C."

Moreover, if it is determined that the device intake air temperature Ta does not exceed the predetermined temperature threshold Ts, the recirculation determination unit 23 determines that there is no recirculation. If it is determined that the device intake air temperature Ta exceeds the predetermined temperature threshold Ts but the number of fan revolutions has not increased, the recirculation determination unit 23 determines that there is no recirculation. If there is no recirculation, the recirculation determination unit 23 notifies the fan control unit 24 that there is no recirculation.

If the fan control unit 24 is notified by the recirculation determination unit 23 that there is no recirculation, the fan control unit 24 calculates the number of fan revolutions suitable for cooling the electronic component 2 based on the electronic component temperature Tj, and changes the applied frequency of the driving voltage to change the number of revolutions of the fan 3. For example, if the fan control unit 24 is notified by the recirculation determination unit 23 that the temperature of air sucked in by the electronic device does not exceed the predetermined temperature threshold Ts, the fan control unit 24 changes the number of revolutions of the fan 3 to the number of fan revolutions suitable for cooling the electronic component 2. If the fan control unit 24 is notified by the recirculation determination unit 23 that the temperature of air sucked in by the electronic device exceeds the predetermined threshold but the number of revolutions of the fan 3 has not increased, the fan control unit 24 changes the number of revolutions of the fan 3 to the number of fan revolutions suitable for cooling the electronic component 2.

If the fan control unit 24 is notified by the recirculation determination unit 23 that recirculation has occurred, the fan control unit 24 performs a process to restore a state with no recirculation by decreasing the number of revolutions of the fan 3. If the fan control unit 24 is notified by the recirculation determination unit 23 that the electronic component temperature Tj exceeds the predetermined upper limit, the fan control unit 24 increases the number of revolutions of the fan 3 until the electronic component temperature Tj becomes lower than the predetermined upper limit. Note that the fan control unit 24 is an example of the decreasing unit and a preventing unit.

Figure 5:
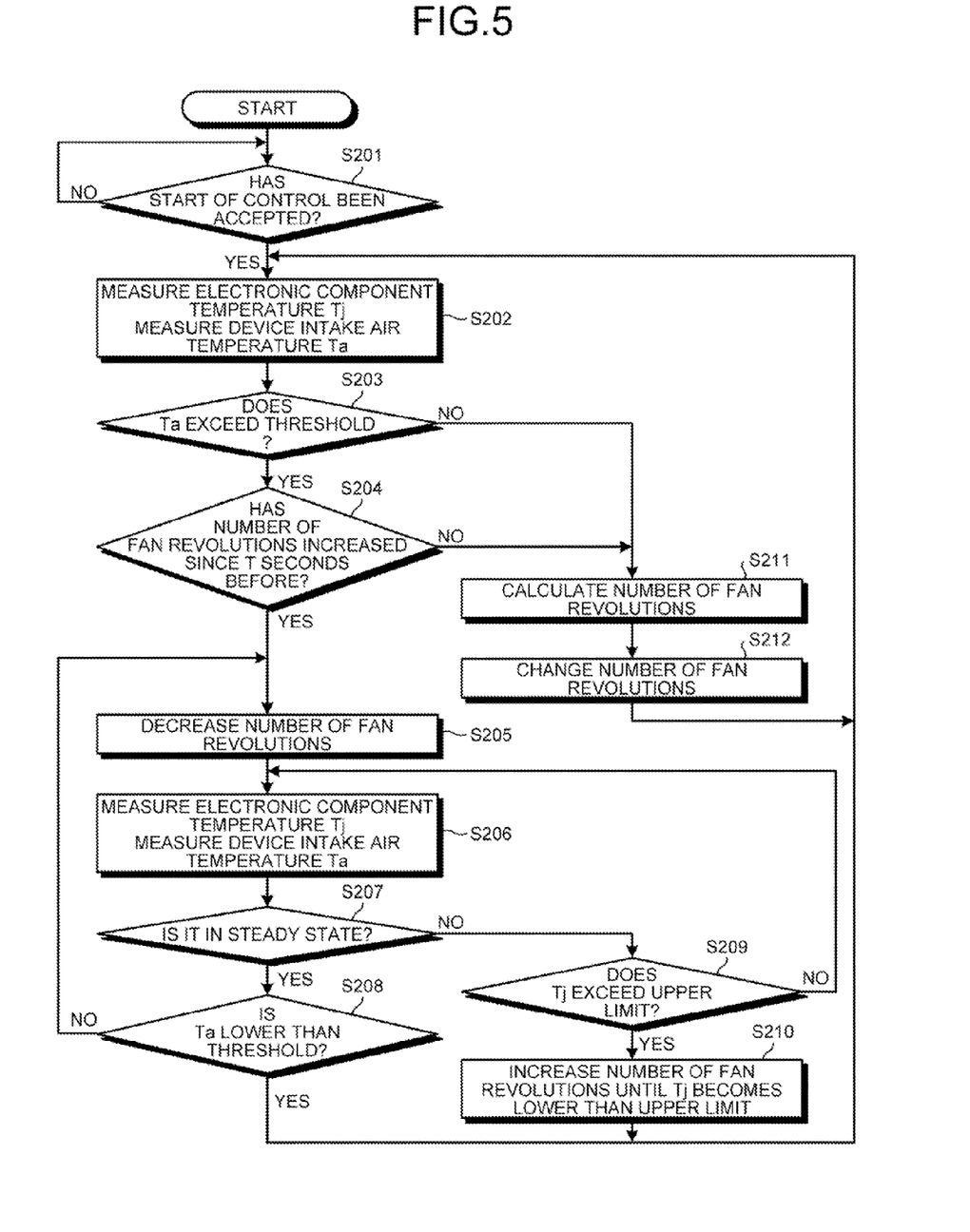
FIG. 5 is a flow chart illustrating a processing procedure by the air volume control device according to the third embodiment.

Processing Procedure by Air Volume Control Device According to the Third Embodiment Next, with reference to FIG. 5, the processing procedure by the air volume control device according to the third embodiment will be described. FIG. 5 is a flow chart illustrating the processing procedure by the air volume control device according to the third embodiment.

As illustrated in FIG. 5, if the air volume control device 22 accepts start of control from a user (step S201, Yes), the air volume control device 22 measures the electronic component temperature Tj and the device intake air temperature Ta (step S202). Note that the air volume control device 22 thereafter measures the electronic component temperature Tj and the device intake air temperature Ta periodically. Subsequently, the air volume control device 22 determines whether or not the device intake air temperature Ta exceeds the threshold (step S203).

Here, if it is determined that the device intake air temperature Ta does not exceed the threshold (step S203, No), the air volume control device 22 calculates the number of revolutions of the fan 3 (step S211), and changes the number of revolutions to the calculated number of revolutions (step S212). Thereafter, the air volume control device 22 proceeds to step S202 and performs the processes to follow.

On the other hand, if it is determined that the device intake air temperature Ta exceeds the threshold (step S203, Yes), the air volume control device 22 determines whether or not the number of fan revolutions has increased from the number of fan revolutions T seconds before (step S204). If it is determined that the number of fan revolutions has not increased from the number of fan revolutions T seconds before (step S204, No), the air volume control device 22 proceeds to the process of step S211, and performs the processes to follow. On the other hand, if it is determined that the number of fan revolutions has increased from the number of fan revolutions T seconds before (step S204, Yes), the air volume control device 22 determines that there is recirculation, and decreases the number of revolutions of the fan 3 (step S205).

Subsequently, the air volume control device 22 measures the electronic component temperature Tj and the device intake air temperature Ta (step S206). Then, the air volume control device 22 determines whether or not it is in a steady state (step S207). Here, if it is determined to be not in a steady state (step S207, No), the air volume control device 22 determines whether or not the electronic component temperature Tj exceeds the predetermined upper limit (step S209). If it is determined that the electronic component temperature Tj exceeds the predetermined upper limit (step S209, Yes), the air volume control device 22 increases the number of revolutions of the fan 3 until the electronic component temperature Tj becomes lower than the upper limit (step S210). Thereafter, the air volume control device 22 proceeds to step S202 and performs the processes to follow. On the other hand, if it is determined that the electronic component temperature Tj does not exceed the predetermined upper limit (step S209, No), the air volume control device 22 proceeds to step S206 and performs the processes to follow.

If it is determined to be in a steady state in step S207 (step S207, Yes), the air volume control device 22 determines whether or not the device intake air temperature Ta is lower than the threshold (step S208). Then, if it is determined that the device intake air temperature Ta is not lower than the threshold (step S208, No), the air volume control device 22 proceeds to step S205 and performs the processes to follow. On the other hand, if it is determined that the device intake air temperature Ta is lower than the threshold (step S208, Yes), the air volume control device 22 proceeds to step S202 and performs the processes to follow.

Advantageous Effect of Third Embodiment

As described above, if the device intake air temperature Ta exceeds the predetermined temperature threshold Ts, the air volume control device according to the third embodiment compares the number of fan revolutions at a time when the device intake air temperature Ta exceeds the predetermined temperature threshold Ts with the number of fan revolutions T seconds prior to that time. Subsequently, if the number of revolutions has increased from the number of fan revolutions T seconds before, the air volume control device determines that there is recirculation. If it is determined that there is recirculation, the air volume control device decreases the number of fan revolutions to eliminate the recirculation. Therefore, it is possible to prevent an increase in the electronic component temperature Tj.

If the electronic component temperature Tj exceeds the preset upper limit temperature, the air volume control device according to the third embodiment determines that the electronic component is thermally at risk, and therefore increases the number of revolutions of the fan 3. Therefore, when the electronic component is thermally at risk, the air volume control device according to the third embodiment can prevent a further increase in the electronic component temperature Tj.

[d] Fourth Embodiment

Heretofore, there has been described the method for determining whether or not the cooling capacity of an electronic device fulfills a predetermined cooling capacity by determining whether or not recirculation has occurred in the electronic device alone. The electronic device as described above is installed in a rack in a data center. By the way, if there is recirculation in a data center, an upper part of the rack sucks in warm air, and a lower part of the rack sucks in cooling air blown out from an under floor. That is, there is a temperature difference between the temperature of air sucked in by the uppermost part of the rack and the temperature of air sucked in by the lowermost part of the rack.

Thus, the fourth embodiment describes a case in which an air volume control device determines whether or not a temperature difference ΔTa between an uppermost part of a rack and a lowermost part of the rack exceeds a predetermined threshold to determine whether or not the cooling capacity of an electronic device fulfills a predetermined cooling capacity. For example, if the temperature difference ΔTa between the uppermost part of the rack and the lowermost part of the rack exceeds the predetermined threshold, the air volume control device determines that there is recirculation, and therefore decreases the number of fan revolutions until ΔTa becomes lower than the predetermined threshold. Here, a configuration of a rack containing an air volume control device according to the fourth embodiment, a processing procedure by the air volume control device according to the fourth embodiment, and an advantageous effect of the fourth embodiment will be described in order.

Figure 6:
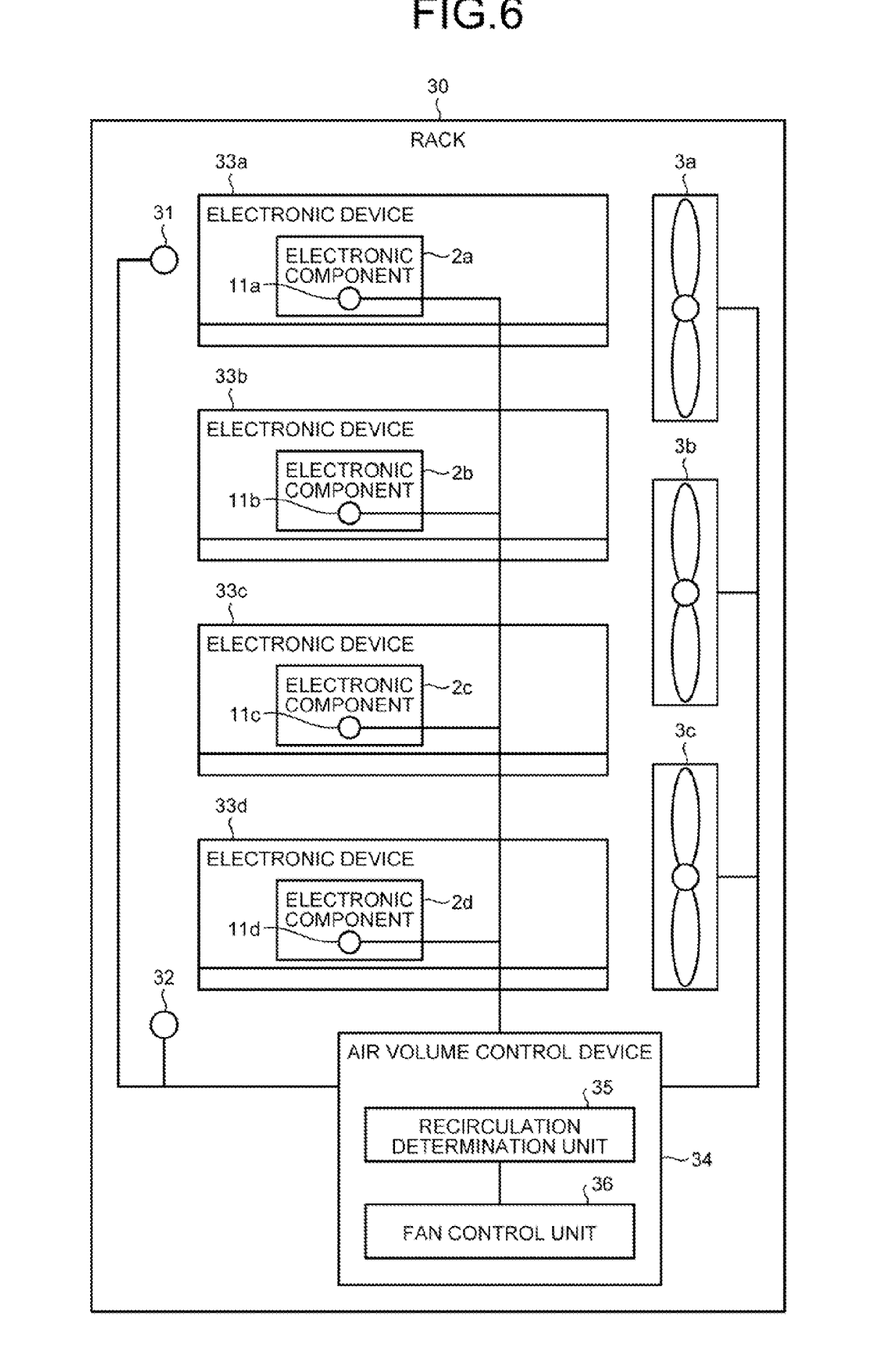
FIG. 6 is a block diagram illustrating a configuration of a rack containing an air volume control device according to a fourth embodiment.

Configuration of Electronic Device Containing Air Volume Control Device According to the Fourth Embodiment Next, with reference to FIG. 6, the configuration of the rack containing the air volume control device according to the fourth embodiment will be described. FIG. 6 is a block diagram illustrating the configuration of the rack containing the air volume control device according to the fourth embodiment. A rack 30 containing the air volume control device according to the fourth embodiment is a housing of 600 mm long, 1000 mm wide, and 2000 mm in height, for example. The rack 30 includes fans 3a, 3b, and 3c, temperature detecting units 31 and 32, electronic devices 33a, 33b, 33c, and 33d, and an air volume control device 34. Note that the rack is an example of the housing. Moreover, functional units operating similarly to the units illustrated in FIG. 2 are denoted by the same reference numerals and the detailed descriptions thereof will be omitted herein. Moreover, the numbers of electronic devices, electronic components, temperature detecting units, and fans are merely illustrative in the fourth embodiment, and the numbers thereof are not limited thereto.

The temperature detecting unit 31 is a thermistor provided at an air intake position of the electronic device positioned in the uppermost part of the rack 30, for example. The temperature detecting unit 31 detects the temperature of air taken in by the electronic device positioned in the uppermost part of the rack 30 after the acceptance of the start of control from a user. Note that a temperature of air taken in by the electronic device positioned in the uppermost part of the rack 30 is hereinafter referred to as a device upper part intake air temperature Ta1. For example, the temperature detecting unit 31 periodically measures the device upper part intake air temperature Ta1, and outputs the measured device upper part intake air temperature Ta1 to a recirculation determination unit 35. In one example, when the device upper part intake air temperature Ta1 is "40° C.," the temperature detecting unit 31 outputs "40° C." to the recirculation determination unit 35.

The temperature detecting unit 32 is a thermistor provided at an air intake position of the electronic device positioned in the lowermost part of the rack 30, for example. The temperature detecting unit 32 detects the temperature of air taken in by the electronic device positioned in the lowermost part of the rack 30 after the acceptance of the start of control from a user. Note that a temperature of air taken in by the electronic device positioned in the lowermost part of the rack 30 is hereinafter referred to as a device lower part intake air temperature Ta2. For example, the temperature detecting unit 32 periodically measures the device lower part intake air temperature Ta2, and outputs the measured device lower part intake air temperature Ta2 to the recirculation determination unit 35. In one example, when the device lower part intake air temperature Ta2 is "30° C.," the temperature detecting unit 32 outputs "30° C." to the recirculation determination unit 35.

Since the electronic devices 33a to 33d have similar configurations, only a configuration of the electronic device 33a will be described herein, and descriptions of the electronic devices 33b to 33d will be omitted. The electronic device 33a includes an electronic component 2a and a temperature detecting unit 11a. Since the electronic component 2a is similar to the electronic component 2 and the temperature detecting unit 11a is similar to the temperature detecting unit 11, detailed descriptions thereof will be omitted herein.

The air volume control device 34 includes the recirculation determination unit 35 and a fan control unit 36. The air volume control device 34 determines whether or not recirculation has occurred, and if there is recirculation, it performs control to eliminate the recirculation.

The recirculation determination unit 35 is a control unit for calculating a temperature difference ΔTa between the device upper part intake air temperature Ta1 notified by the temperature detecting unit 31 and the device lower part intake air temperature Ta2 notified by the temperature detecting unit 32, and determining whether or not the calculated temperature difference ΔTa exceeds a predetermined threshold. Note that the recirculation determination unit 35 is an example of the determination unit.

If it is determined that the temperature difference ΔTa between the device upper part intake air temperature Ta1 and the device lower part intake air temperature Ta2 exceeds the predetermined threshold, the recirculation determination unit 35 determines that recirculation has occurred. In such a case, the recirculation determination unit 35 starts a process to restore a state with no recirculation. For example, the recirculation determination unit 35 notifies the fan control unit 36 that recirculation has occurred. As a result, the fan control unit 36 decreases the number of fan revolutions. Note that the predetermined threshold of the temperature difference ΔTa can be arbitrarily set by a user, and is "10° C.," for example.

The recirculation determination unit 35 determines whether or not it is in a steady state after the process to restore a state with no recirculation is started. If it is determined to be in a steady state, the recirculation determination unit 35 determines whether or not the temperature difference ΔTa between the device upper part intake air temperature Ta1 and the device lower part intake air temperature Ta2 is lower than the predetermined threshold.

If it is determined that the temperature difference ΔTa between the device upper part intake air temperature Ta1 and the device lower part intake air temperature Ta2 is lower than the predetermined threshold, the recirculation determination unit 35 determines that recirculation has been eliminated. Then, the recirculation determination unit 35 transitions to a normal control state again.

If it is determined that the temperature difference ΔTa between the device upper part intake air temperature Ta1 and the device lower part intake air temperature Ta2 is not lower than the predetermined threshold, the recirculation determination unit 35 determines that recirculation has not been eliminated yet. In such a case, the recirculation determination unit 35 notifies the fan control unit 36 that recirculation has not been eliminated yet. As a result, the fan control unit 36 repeats an operation of further decreasing the number of fan revolutions until it is determined that recirculation has been eliminated.

Moreover, if it is determined to be not in a steady state, the recirculation determination unit 35 continuously determines whether or not it is in a steady state.

If it is determined that the temperature difference ΔTa between the device upper part intake air temperature Ta1 and the device lower part intake air temperature Ta2 does not exceed the predetermined threshold, the recirculation determination unit 35 determines that there is no recirculation. In such a case, the recirculation determination unit 35 notifies the fan control unit 36 that there is no recirculation.

If the fan control unit 36 is notified by the recirculation determination unit 35 that there is no recirculation, the fan control unit 36 calculates the number of fan revolutions suitable for cooling respective electronic components 2a to 2d of the electronic devices 33a to 33d from the electronic component temperature Tj, and changes the applied frequency of the driving voltage to change the number of revolutions of the fans 3a to 3c. For example, if the fan control unit 36 is notified by the recirculation determination unit 35 that the temperature difference ΔTa between the device upper part intake air temperature Ta1 and the device lower part intake air temperature Ta2 does not exceed the predetermined threshold, the fan control unit 36 changes the number of revolutions of the fans 3a to 3c to the number of fan revolutions suitable for cooling the electronic components 2a to 2d.

If the fan control unit 36 is notified by the recirculation determination unit 35 that there is recirculation, the fan control unit 36 starts a process to restore a state with no exhaust air recirculation by decreasing the number of revolutions of the fans 3a to 3c. Moreover, if the fan control unit 36 is notified by the recirculation determination unit 35 that recirculation has not been eliminated yet, the fan control unit 36 decreases the number of revolutions of the fans 3a to 3c. Note that the fan control unit 36 is an example of the decreasing unit.

Figure 7:
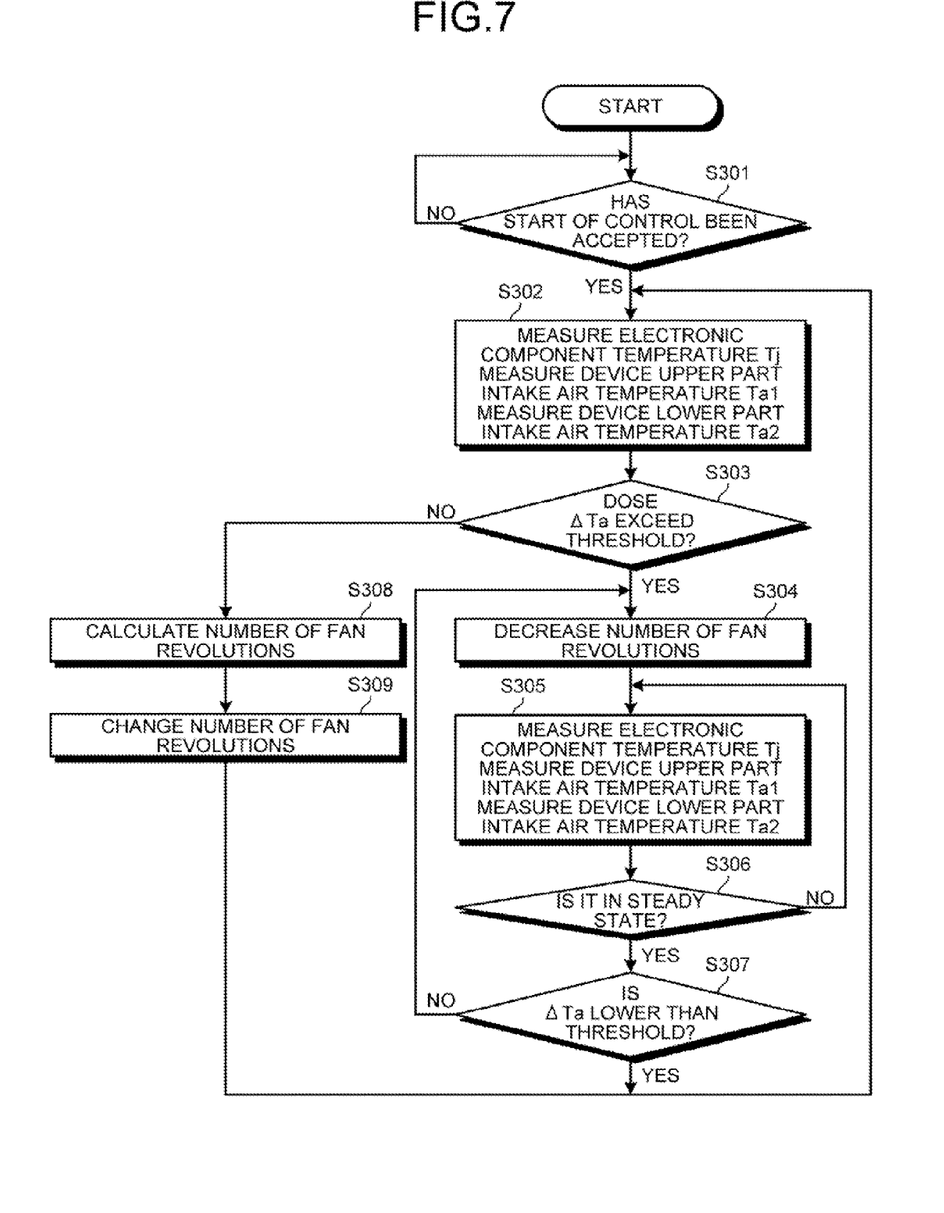
FIG. 7 is a flow chart illustrating a processing procedure by the air volume control device according to the fourth embodiment.

Processing Procedure by Air Volume Control Device According to the Fourth Embodiment Next, with reference to FIG. 7, the processing procedure by the air volume control device 34 according to the fourth embodiment will be described. FIG. 7 is a flow chart illustrating the processing procedure by the air volume control device according to the fourth embodiment.

As illustrated in FIG. 7, if the air volume control device 34 accepts start of control from a user (step S301, Yes), the air volume control device 34 measures the electronic component temperature Tj, the device upper part intake air temperature Ta1, and the device lower part intake air temperature Ta2 (step S302). Note that the air volume control device 34 thereafter measures the electronic component temperature Tj, the device upper part intake air temperature Ta1, and the device lower part intake air temperature Ta2 at regular time intervals.

Subsequently, the air volume control device 34 determines whether or not the temperature difference ΔTa between the device upper part intake air temperature Ta1 and the device lower part intake air temperature Ta2 exceeds the predetermined threshold (step S303). Here, if it is determined that the temperature difference ΔTa between the device upper part intake air temperature Ta1 and the device lower part intake air temperature Ta2 does not exceed the predetermined threshold (step S303, No), the air volume control device 34 calculates the number of revolutions of the fans 3a to 3c (step S308). Then, the air volume control device 34 changes the number of revolutions of the fans 3a to 3c to the calculated number of revolutions (step S309). Thereafter, the air volume control device 34 proceeds to step S302 and performs the processes to follow.

On the other hand, if it is determined that the temperature difference ΔTa between the device upper part intake air temperature Ta1 and the device lower part intake air temperature Ta2 exceeds the predetermined threshold (step S303, Yes), the air volume control device 34 decreases the number of revolutions of the fans 3a to 3c (step S304). Then, the air volume control device 34 measures the electronic component temperature Tj, the device upper part intake air temperature Ta1, and the device lower part intake air temperature Ta2 (step S305). Subsequently, the air volume control device 34 determines whether or not it is in a steady state (step S306).

If it is determined to be not in a steady state (step S306, No), the air volume control device 34 proceeds to step S305 and performs the processes to follow. On the other hand, if it is determined to be in a steady state (step S306, Yes), the air volume control device 34 determines whether or not the temperature difference ΔTa between the device upper part intake air temperature Ta1 and the device lower part intake air temperature Ta2 is lower than the predetermined threshold (step S307).

If it is determined that the temperature difference ΔTa between the device upper part intake air temperature Ta1 and the device lower part intake air temperature Ta2 is lower than the predetermined threshold (step S307, Yes), the air volume control device 34 proceeds to step S302 and performs the processes to follow. On the other hand, if it is determined that the temperature difference ΔTa between the device upper part intake air temperature Ta1 and the device lower part intake air temperature Ta2 is not lower than the predetermined threshold (step S307, No), the air volume control device 34 proceeds to step S304 and performs the processes to follow.

Advantageous Effect of Fourth Embodiment

As described above, if the temperature difference ΔTa between the device upper part intake air temperature Ta1 and the device lower part intake air temperature Ta2 exceeds the predetermined threshold, the air volume control device 34 according to the fourth embodiment determines that there is recirculation. When it is determined that recirculation has occurred, the air volume control device decreases the number of fan revolutions to eliminate the recirculation. Therefore, it is possible to prevent an increase in the electronic component temperature Tj.

[e] Fifth Embodiment

The air volume control device disclosed in the present application may be carried out in various different modes in addition to the embodiments described above. Thus, the fifth embodiment describes another embodiment of the air volume control device disclosed in the present application.

Configuration and the Like

Among the processes described in the embodiments of the present invention, all or part of the processes described as being automatically performed can be performed manually. Alternatively, all or part of the processes described as being manually performed can be performed automatically with known methods. Furthermore, the processing procedures, the control procedures, and the specific terms illustrated in the above-described text and drawings can be changed as desired if not otherwise specified.

Moreover, when there is no change in load on the electronic component, the air volume control device according to the second embodiment determines whether or not there is recirculation. For example, it has been described that the air volume control device according to the second embodiment determines whether or not the CPU utilization has changed, and if there is no change in CPU utilization, it determines whether or not there is recirculation. However, the method for determining whether or not there is a load on an electronic component by the air volume control device is not limited thereto. For example, the air volume control device may be designed and configured so that the air volume control device monitors the number of signals or a memory usage per unit time instead of CPU utilization, and if these have not changed, it determines whether or not there is recirculation.

Moreover, the air volume control device can combine, as desired, the methods for determining whether or not recirculation has occurred, which have been described in the embodiments. For example, the electronic devices 33a and 33b in the fourth embodiment determine whether or not recirculation has occurred based on the temperature difference $\Delta Ta$ between the device upper part intake air temperature Ta1 and the device lower part intake air temperature Ta2, which is the method described in the fourth embodiment. The electronic device 33c determines whether or not recirculation has occurred based on the device intake air temperature Ta, which is the method described in the third embodiment. Moreover, the electronic device 33d determines whether or not recirculation has occurred based on the electronic component temperature Tj, which is the method described in the second embodiment.

Moreover, for example, the air volume control devices in the second and fourth embodiments may be designed and configured so that if the electronic component temperature Tj exceeds the preset upper limit temperature, they determine that the electronic component is thermally at risk, thereby increasing the number of revolutions of the fans 3a to 3c.

Moreover, the components illustrated in the figures are functionally conceptual, and they are not necessarily required to be physically configured as illustrated in the figures. For example, in the air volume control device 12, the load measuring unit 13 and the recirculation determination unit 15 may be integrated together. Furthermore, all or a desired part of the processing functions performed by the devices may be realized by a CPU and a program analyzed and executed by the CPU, or may be realized as a hardware by a wired logic.

Program

The various processes explained in the above-described embodiments can be carried out by executing a program prepared in advance by a personal computer or a computer system such as a work station. Thus, an example of a computer system to execute a program having functions similar to those in the above-described embodiments will be described below.

Figure 8:
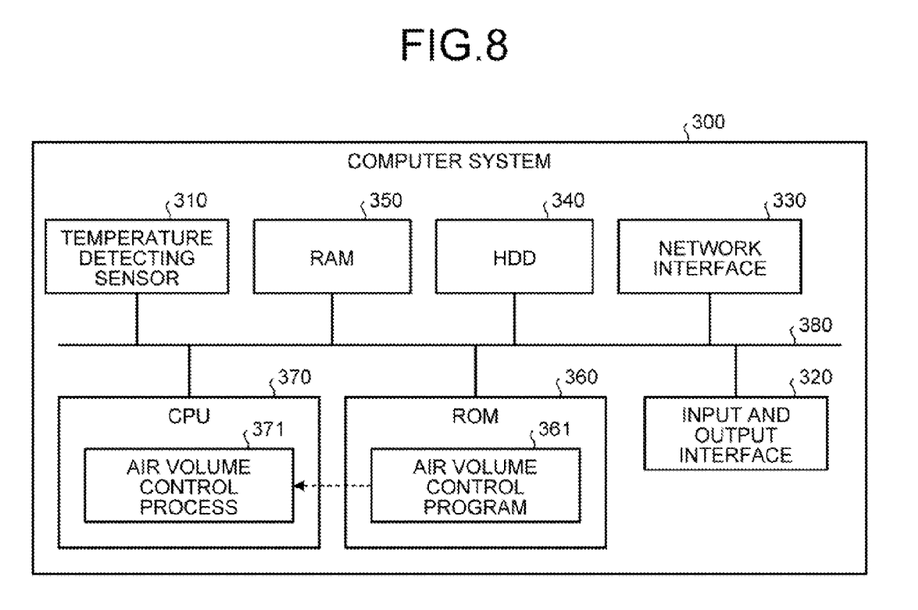
FIG. 8 is a diagram illustrating a computer system for executing an air volume control program.

FIG. 8 is a diagram illustrating a computer system for executing an air volume control program. As illustrated in FIG. 8, a computer system 300 includes a temperature detecting sensor 310 for detecting a temperature of an electronic component, and an input and output interface 320 for accepting various settings from a user or notifying a status of the computer system and the like. The computer system 300 also includes a network interface 330 for transmitting and receiving data to and from other devices, an HDD 340, a RAM 350, a ROM (read only memory) 360, a CPU 370, and a bus 380. The respective devices 310 to 370 are connected to the bus 380.

Here, as illustrated in FIG. 8, the ROM 360 prestores an air volume control program 361 exerting functions similar to those of the determination unit 5 and the decreasing unit 6 illustrated in FIG. 1.

Then, the CPU 370 reads out the air volume control program 361 from the ROM 360, and executes it as an air volume control process 371. That is, the air volume control process 371 performs operations similar to those of the determination unit 5 and the decreasing unit 6 illustrated in FIG. 1.

By the way, the air volume control program 361 described above is not necessarily required to be stored in the ROM 360. For example, the air volume control program 361 may be stored in a "transportable physical medium" such as a flexible disk (FD), a CD-ROM, an MO disk, a DVD disk, a magneto-optical disk, or an IC card to be inserted in the computer system 300. Alternatively, the air volume control program 361 may be stored in a "fixed physical medium" such as a hard disk drive (HDD) provided inside or outside of the computer system 300. Furthermore, the air volume control program 361 may be stored in "another computer system" connected to the computer system 300 via a public line, the Internet, a LAN (local area network), a WAN (wide area network), or the like. Then, the computer system 300 may read out the program therefrom for execution.

That is, this program is stored in a recording medium such as the above-described "transportable physical medium," "fixed physical medium," or "communication medium" in a computer-readable form. Then, the computer system 300 reads out the program from such a recording medium and executes it, thereby carrying out functions similar to those in the above-described embodiments. Note that the program referred in this another embodiment is not limited to being executed by the computer system 300. For example, the present invention can be similarly applied also to a case where another computer system or server executes the program or a case where they execute the program in cooperation.

According to an aspect of an embodiment, it is possible to prevent an increase in electronic component temperature.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An air volume control device, comprising:
a memory; and
a processor coupled to the memory, wherein the processor is programmed to
(a) periodically measure a temperature of an electronic component,
(b) measure a processing load on the electronic component,
(c) determine whether or not a cooling capacity of an electronic device fulfills a predetermined cooling capacity based on the measured temperature and measured processing load of the electronic component,

(d) decrease the number of revolutions of a fan for cooling the electronic device when it is determined that the cooling capacity of the electronic device is failing to fulfill the predetermined cooling capacity, (e) determine whether a steady state is achieved or not, the steady state being a state in which the fan is stably operated with the number of revolutions being restored to a predetermined number of revolution, and (f) determine, when it is determined that the steady state is achieved, whether recirculation stops or not, and return to a step (b) when it is determined that the steady state is not achieved.

2. The air volume control device according to claim 1, wherein the processor is further programmed to compare a temperature of the electronic component provided in the electronic device before a change in the number of revolutions of the fan with that after the change in the number of revolutions of the fan, and determine that the cooling capacity of the electronic device is failing to fulfill the predetermined cooling capacity if the temperature of the electronic component is increased when the number of revolutions of the fan is increased or if the temperature of the electronic component is decreased when the number of revolutions of the fan is decreased.

3. The air volume control device according to claim 2, wherein
if there is no change in the processing load on the electronic component, the processor compares the temperature of the electronic component before the change in the number of revolutions of the fan with that after the change in the number of revolutions of the fan.

4. The air volume control device according to claim 1, wherein if a temperature of air sucked in by the electronic device exceeds a predetermined threshold and the number of revolutions of the fan has increased from that previously detected, the processor determines that the cooling capacity of the electronic device is failing to fulfill the predetermined cooling capacity.

5. The air volume control device according to claim 1, wherein if a temperature difference between a temperature of air in an upper part inside a housing storing the electronic device and a temperature of air in a lower part thereof exceeds a predetermined threshold, the processor determines that the cooling capacity of the electronic device is failing to fulfill the predetermined cooling capacity.

6. The air volume control device according to claim 1, wherein the processor further prevents a temperature increase in the electronic component by increasing the number of revolutions of the fan if a temperature of the electronic component exceeds a predetermined threshold.

7. An air volume control method, executed by a computer, comprising:
(a) periodically measuring a temperature of an electronic component;
(b) measuring a processing load on the electronic component;
(c) determining, by the computer, whether or not a cooling capacity of an electronic device fulfills a predetermined cooling capacity based on the measured temperature and measured processing load;
(d) decreasing, by the computer, the number of revolutions of a fan for cooling the electronic device if it is determined in the determining that the cooling capacity of the electronic device is failing to fulfill the predetermined cooling capacity,
(e) determining, by the computer, whether a steady state is achieved or not, the steady state being a state in which the fan is stably operated with the number of revolutions being restored to a predetermined number of revolution, and
(f) determining, by the computer, when it is determined that the steady state is achieved, whether recirculation stops or not, and returning to a step (b) when it is determined that the steady state is not achieved.

8. A non-transitory computer-readable storage medium storing an air volume control program causing a computer to perform:
(a) periodically measuring a temperature of an electronic component;
(b) measuring a processing load on the electronic component;
(c) determining whether or not a cooling capacity of an electronic device fulfills a predetermined cooling capacity based on the measured temperature and measured processing load;
(d) decreasing the number of revolutions of a fan for cooling the electronic device if it is determined in the determining that the cooling capacity of the electronic device is failing to fulfill the predetermined cooling capacity,
(e) determining whether a steady state is achieved or not, the steady state being a state in which the fan is stably operated with the number of revolutions being restored to a predetermined number of revolution, and
(f) determining when it is determined that the steady state is achieved, whether recirculation stops or not, and returning to a step (b) when it is determined that the steady state is not achieved.

* * * * *